(12) United States Patent
Chen

(10) Patent No.: US 12,283,334 B2
(45) Date of Patent: Apr. 22, 2025

(54) METHOD AND APPARATUS FOR MEMORY TESTING

(71) Applicant: Winbond Electronics Corp., Taichung (TW)

(72) Inventor: Shih-Hung Chen, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 29 days.

(21) Appl. No.: 18/366,690

(22) Filed: Aug. 8, 2023

(65) Prior Publication Data

US 2024/0312556 A1    Sep. 19, 2024

(30) Foreign Application Priority Data

Mar. 14, 2023    (TW) ................................. 112109420

(51) Int. Cl.
*G11C 29/56* (2006.01)
(52) U.S. Cl.
CPC .............................. *G11C 29/56016* (2013.01)
(58) Field of Classification Search
CPC .............................................. G11C 29/56016
See application file for complete search history.

(56) References Cited

U.S. PATENT DOCUMENTS

| | | | | |
|---|---|---|---|---|
| 6,028,994 A | * | 2/2000 | Peng | H01L 22/20 703/15 |
| 2004/0138846 A1 | * | 7/2004 | Buxton | G06F 18/2433 702/108 |
| 2008/0189575 A1 | * | 8/2008 | Miguelanez | G05B 23/0229 714/25 |
| 2021/0279388 A1 | * | 9/2021 | Burch | G06F 30/27 |

FOREIGN PATENT DOCUMENTS

TW    202310110    3/2023

OTHER PUBLICATIONS

"Office Action of Taiwan Counterpart Application", issued on Nov. 13, 2023, p. 1-p. 8.

* cited by examiner

*Primary Examiner* — Samir W Rizk
(74) *Attorney, Agent, or Firm* — JCIPRNET

(57) ABSTRACT

Disclosed are a method and an apparatus for memory testing. The method comprises following steps: using a test program group including N test programs to test M dies respectively to generate independent N test data, wherein N and M are positive integers greater than 1; and executing a neural network operation on the N test data to estimate a yield of M dies passing the test program group.

16 Claims, 9 Drawing Sheets

METHOD AND APPARATUS FOR MEMORY TESTING

CROSS-REFERENCE TO RELATED APPLICATION

This application claims the priority benefit of Taiwan application serial no. 112109420, filed on Mar. 14, 2023. The entirety of the above-mentioned patent application is hereby incorporated by reference herein and made a part of this specification.

BACKGROUND

Technical Field

The disclosure relates to a memory testing method, and in particular to a memory testing method and an apparatus capable of shortening testing time.

Description of Related Art

In the process of memory development, it is necessary to carry out testing procedures on the wafers to determine whether the functions of the dies on the wafers are normal. Each test program is composed of many test programs representing different electrical physical meanings. Currently, it takes too much time to run through all the test programs and only get a one-time result. Even if some of the test cause serious yield loss programs during the test process, it is necessary to adjust the sequence of the test programs and re-run the test program to know whether there is a problem with the test results of the subsequent test programs. In addition, when there is a temporary need to increase test programs, reduce test programs, switch program test sequences, or modify program conditions, all test programs need to be re-executed, resulting in the huge expenditure of the testing time. Therefore, how to obtain more effective data and shorten testing time with limited test cost has become an increasingly important topic in this field.

SUMMARY

The disclosure provides a memory testing method and apparatus, which may obtain more effective data and greatly shorten testing time with limited test cost.

The memory testing method of the disclosure includes the following steps: using a test program group including N test programs to test M dies respectively to generate independent N test data, wherein N and M are positive integers greater than 1; and performing a neural network operation on the N test data to estimate the yields of the M dies passing the test program group.

The memory testing apparatus includes a clamp, a storage device, a test control device. The clamp is configured to clamp the M dies to be tested. The storage device is configured to store the test program group. The test control device is coupled to the clamp and the storage device. The test control device is configured to use the test program group including the N test programs to test the M dies respectively to generate independent N test data, wherein N and M are positive integers greater than 1; and perform the neural network operation on the N test data to estimate the yields of the M dies passing the test program group.

Based on the above, the memory testing method and apparatus of the disclosure may obtain "independent" test data (test results) of each test program. The use of these "independent" test data to perform a neural network operation is to quickly estimate the die yield. In this way, more effective data may be obtained and the testing time may be greatly shortened.

DESCRIPTION OF THE EMBODIMENTS

Figure 1:
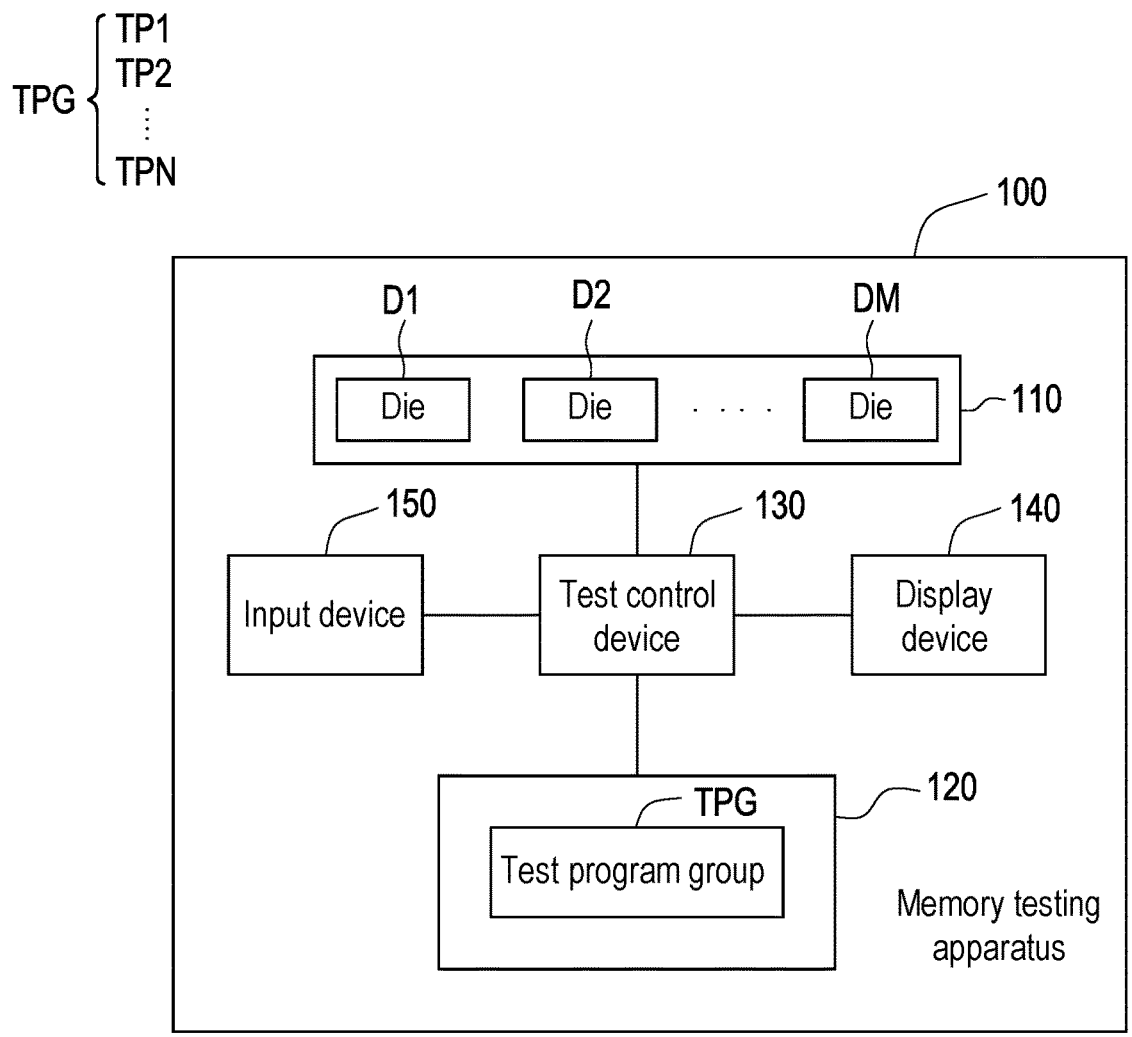
FIG. 1 is a schematic diagram of a memory testing apparatus according to an embodiment of the disclosure.

Refer to FIG. 1, the memory testing apparatus 100 of the embodiment may, for example, test M dies D1~DM. The memory testing apparatus 100 includes a clamp 110, a storage device 120, a test control device 130, a display device 140 and an input device 150.

The clamp 110 is configured to clamp the M dies D1~DM to be tested. For example, the clamp 110 may hold an entire wafer to test the M dies D1~DM on the wafer.

The storage device 120 is, for example, any type of fixed or removable random access memory (RAM), read-only memory (ROM), flash memory, hard disk or similar component or a combination of the above components, and may be configured to store the test program group TPG and the data used. In this embodiment, the stored test program group TPG includes N test programs TP1~TPN.

The test control device 130 is, for example, a central processing unit (CPU), or other programmable general-purpose or special-purpose microprocessor, digital signal processor (DSP), programmable controller, application specific integrated circuit (ASIC) or other similar components or a combination of the above components.

The display device 140 is, for example, a display using a liquid crystal display (LCD), a light emitting diode (LED), a field emission display (FED) or other types of displays.

The input device 150 is, for example, a mouse, an input button, a remote controller, a touchpad or a touch panel with resistive, capacitive or other types of touch sensing components, and may receive operations from the user. The input device 150, for example, may also be combined with the display device 140 to form a touch panel, which may receive a user's touch operation on the screen on the display device 140.

As shown in FIG. 1, the test control device 130 is coupled to the clamp 110, the storage device 120, the display device 140 and the input device 150. In this embodiment, the test control device 130 may perform a test procedure on the M dies D1~DM held by the clamp 110, so as to execute the memory testing method of the embodiment of the disclosure. The memory testing method of the embodiment of the disclosure, for example, may be applied to the stage of wafer probing (CP), but the disclosure is not limited to this, and in other embodiments, it may also be tested in the final test (FT) after packaging or at other stages of testing.

Figure 2:
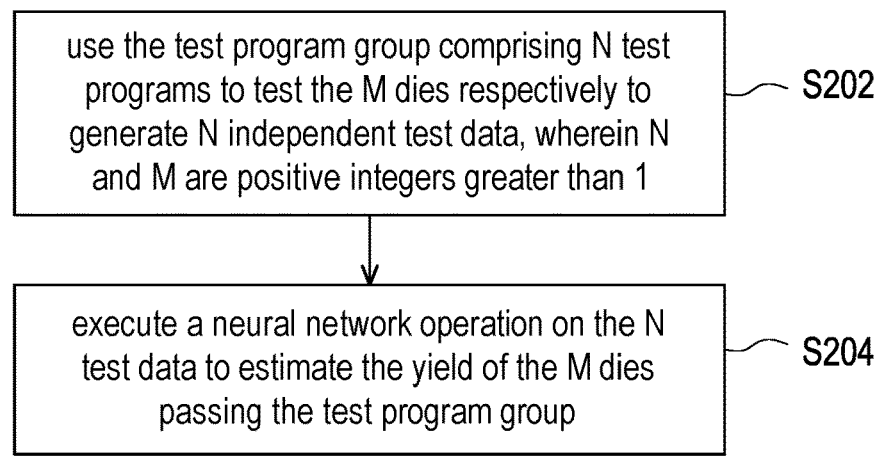
FIG. 2, FIG. 3, FIG. 5, and FIG. 8 are flowcharts of steps of a memory testing method according to an embodiment of the disclosure.

Refer to FIG. 1 and FIG. 2. The memory testing method of this embodiment is applicable to the memory testing apparatus 100 of FIG. 1. The steps of the memory testing method according to the embodiment of the disclosure will be described below in combination with various components in the memory testing apparatus 100.

In step S202, the test control device 130 uses the test program group TPG including N test programs TP1~TPN to test the M dies D1~DM respectively to generate N independent test data Data1~DataN. N and M are positive integers greater than 1. Each test program TP1~TPN represents a different physical meaning of electrical properties and has a different test purpose. For example, the test programs TP1~TPN at least include a test program related to the time required for the write operation (data tWR) and margin, a test program related to the gate-induced drain leakage present (GIDL), a test program related to data retention, a test program related to precharge time and delay time between ranks (tRP, RCD), a test program related to row hammer, a test program related to various leakage, and a test program related to hard defect, such as short circuits and open circuits between metals on structures, but the disclosure is not limited thereto.

Figure 3:
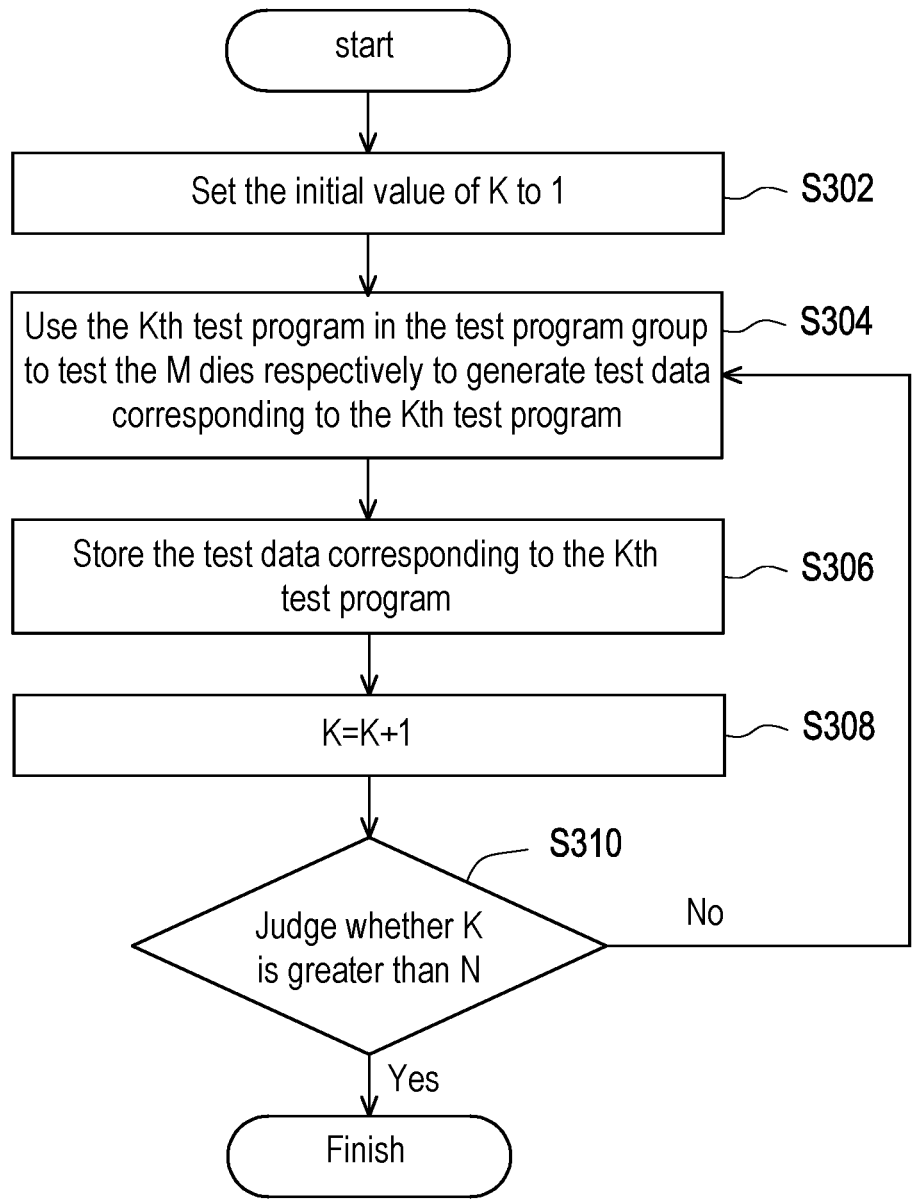

In this embodiment, the detailed steps for generating independent N test data Data1-DataN may refer to each step in FIG. 3. Refer to FIG. 1 and FIG. 3. First, in step S302, the test control device 130 sets the initial value of K to 1. Next, in step S304, the test control device 130 uses the K-th test program TPK in the test program group TPG to test the M dies D1~DM respectively to generate test data DataK corresponding to the K-th test program. For example, when step S304 is executed for the first time, the test control device 130 uses the first test program TP1 in the test program group TPG to test the M dies D1~DM respectively to generate test data Data1. Since K will be subsequently incremented, when step S304 is executed for the second time, the test control device 130 uses the second test program TP2 in the test program group TPG to test the M dies D1~DM respectively to generate test data Data2, and so on.

Next, in step S306, the test control device 130 stores the test data DataK corresponding to the K-th test program TPK in the storage device 120. In practical applications, after the test data DataK is stored, the test results displayed on the machine may be deleted to continue subsequent tests.

Next, in step S308, the test control device 130 increments K (K=K+1). In step S310, the test control device 130 judges whether the incremented K is greater than N or not.

When K is not greater than N, it means that there are still test programs that have not been used for testing. The test control device 130 returns to step S304, and continues to repeat step S304, step S306, step S308, and step S310 until K is incremented to be greater than N.

When K is greater than N, it means that all test programs have been used for testing, and independent N test data Data1~DataN have been generated.

It should be noted that users may arbitrarily add test programs to the test program group TPG or delete test programs from the test program group TPG according to their actual needs, and the test control device 130 may also generate corresponding test data accordingly. For example, the user may delete the test program related to the hard defect from the test program group TPG, so that the test program may focus on testing the relative time characteristics of writing and reading.

Figure 4:
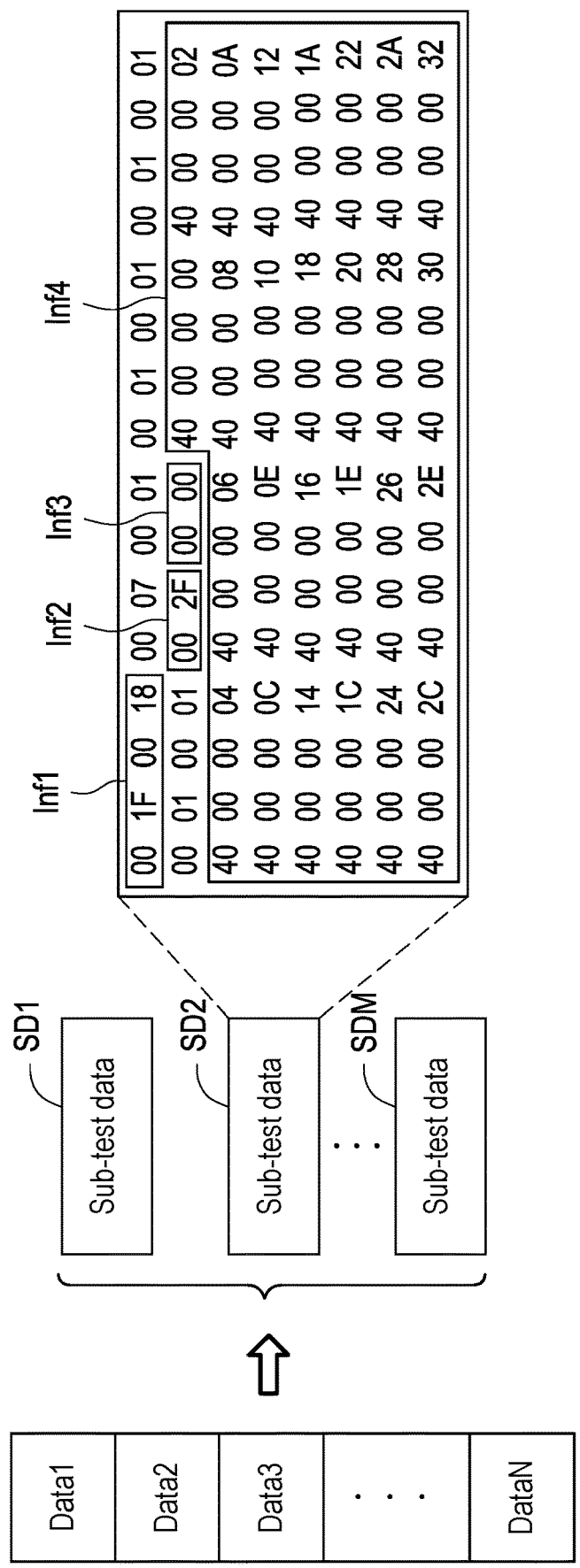
FIG. 4 is an example of sub-test data shown according to an embodiment of the disclosure.

Refer to FIG. 2, in step S204, the test control device 130 executes a neural network operation on the N test data Data1-DataN to estimate the yield of the M dies D1-DM passing the test program group TPG. In this embodiment, the neural network operation is performed, for example, according to the column and row repair position rule of memory and the neural network model, and the operation is performed through a programming language such as Python or C. Each of the test data Data1-DataN includes M sub-test data SD1~SDM respectively corresponding to M dies D1-DM. For example, FIG. 4 shows an example of the sub-test data SD1~SDM according to an embodiment of the disclosure. The test data Data1~DataN are, for example, .dat data files. Taking the test data Data3 as an example, the test data Data3 includes M sub-test data SD1~SDM. Each of sub-test data SD1~SDM includes die position information Inf1, row repair number information Inf2, column repair number information Inf3, and row and column repair position information Inf4. For example, in the sub-test data SD2, the die position information Inf1 is "001F0018", which means that the position coordinates of the die corresponding to this data on the wafer are X31, Y24. The row repair number information Inf2 is "002F", which means that there are 47 rows (damaged rows) to be repaired on the die corresponding to this data. The column repair number information Inf3 is "0000", which means that there are 0 column (damaged columns) to be repaired on the die corresponding to this data. The row and column repair position information Inf4 indicates which row and column are the rows and columns to be repaired, for example, "40000000" indicates that the row to be repaired is zeroth row, and "40000002" indicates that the row to be repaired is the second row.

Figure 5:
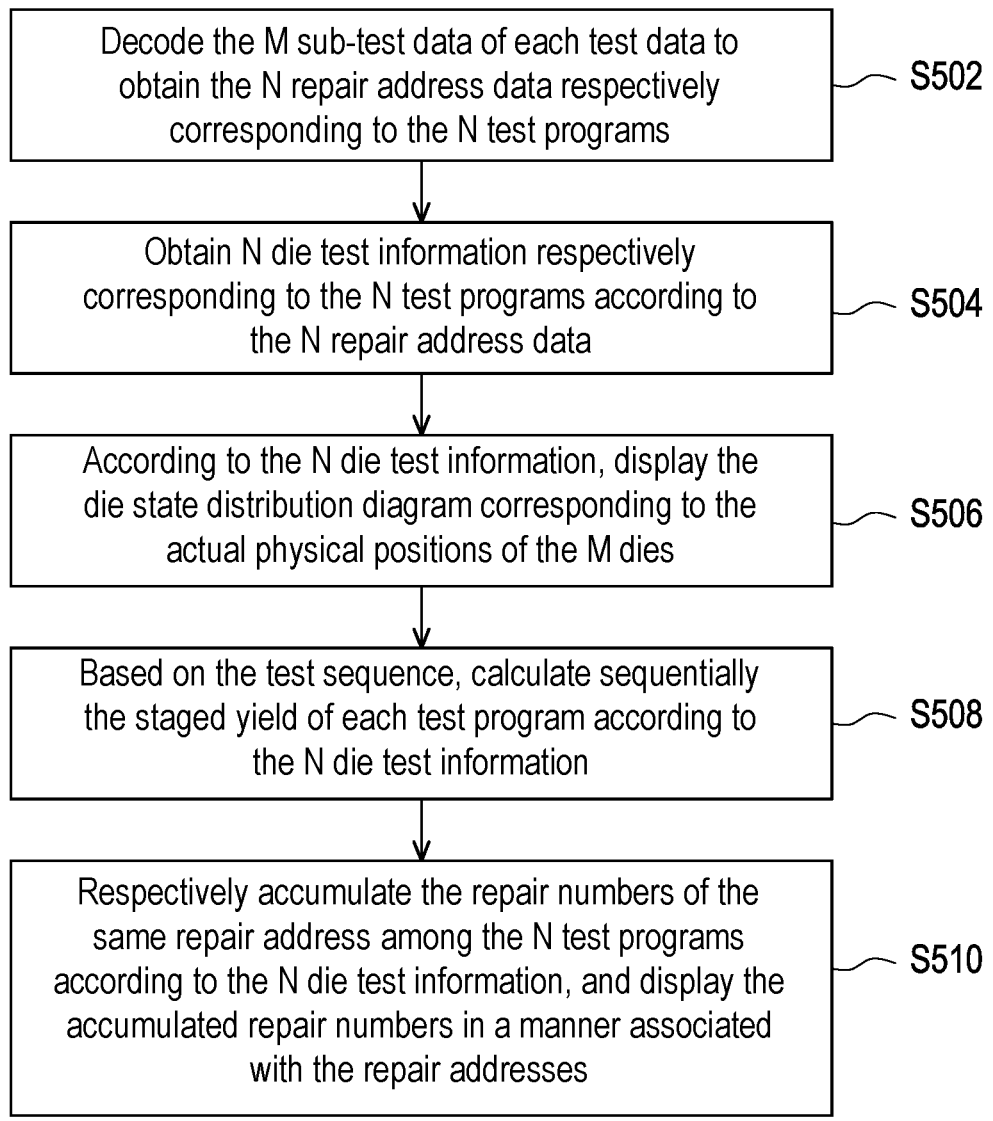

In this embodiment, the detailed steps of performing the neural network operation on the Nth test data Data1~DataN may refer to the steps in FIG. 5. Refer to FIG. 1, first, in step 502, the test control device 130 decodes the M sub-test data SD1~SDM of each of test data Data1~DataN to obtain the N repair address data Rads1~RadsN respectively corresponding to the N test programs TP1~TPN.

Figure 6:
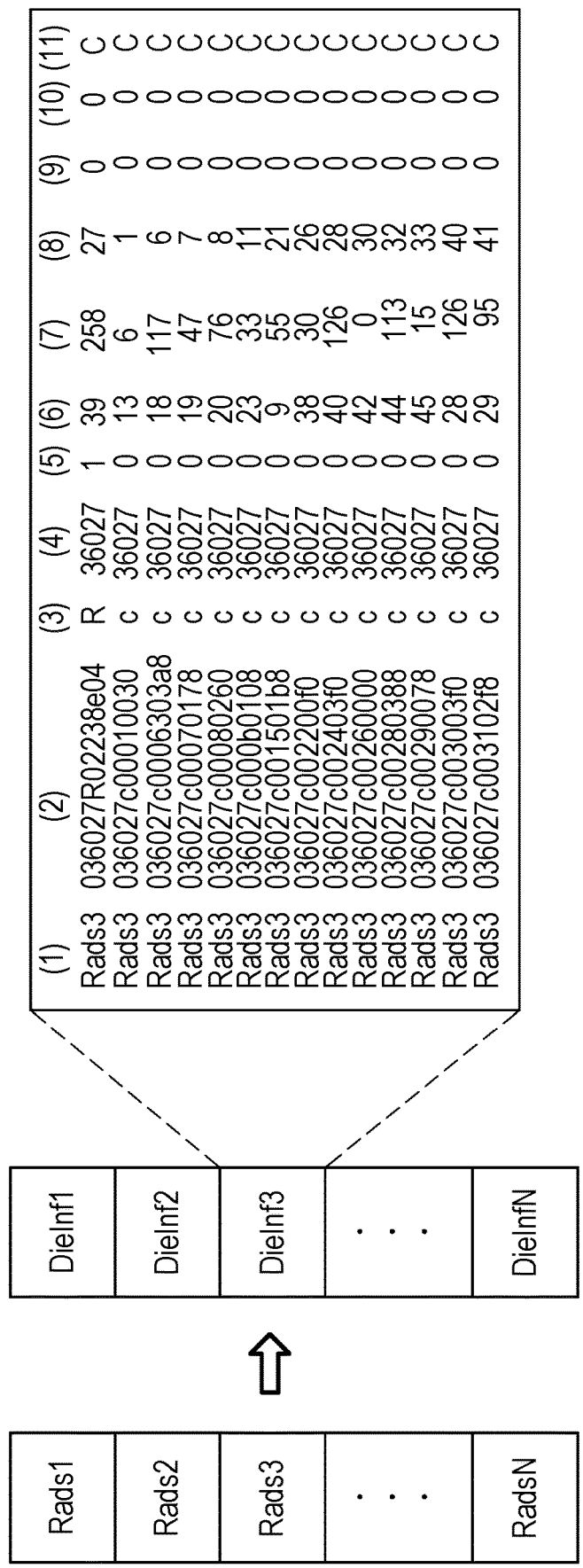
FIG. 6 is an example of die test information shown according to an embodiment of the disclosure.

Next, in step 504, the test control device 130 obtains N die test information DieInf1~DieInfN respectively corresponding to the N test programs TP1~TPN according to the N repair address data Rads1~RadsN. For example, FIG. 6 shows an example of die test information according to an embodiment of the disclosure. The repair address data Rads1~RadsN are, for example, .csv data files, and the content is a hexadecimal address. As shown in FIG. 6, the repair address data Rads1~RadsN are analyzed or decoded again to obtain the die test information DieInf1~DieInfN. Taking the die test information DieInf3 corresponding to the test program TP3 as an example, in FIG. 6, the die test information DieInf3 includes (1) the program or item name of the corresponding repair address data, (2) the decimal die position number/hexadecimal address, (3) repair classification (R/C, R stands for row, C stands for column), (4) die position number, repair position (including (5) Bank, (6) Segment/Block, (7) Col/Row, (8) Electrical_R-SEG, (9) Redundancy area, (10) Output data (DQU/L) and (11) wafer area (Zone)) and other related information. In this way, according to the die test information DieInf1~DieInfN, the test control device 130 may obtain the position of each die D1~DM, and the position and number of each die D1~DM that need repairing (damaged), and may accurately know which position is problematic.

Figure 7A:
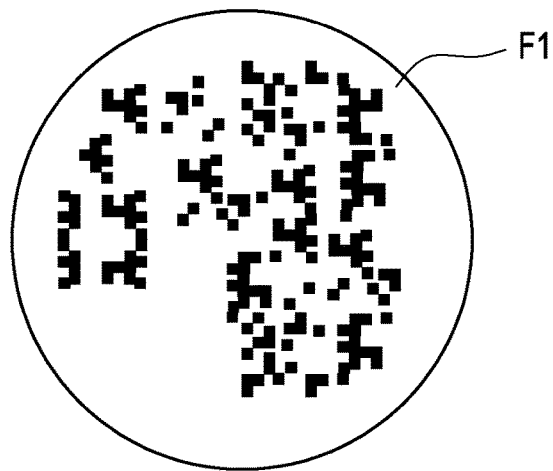
FIG. 7A and FIG. 7C are examples of die state distribution diagrams drawn according to an embodiment of the disclosure.

Please return to FIG. 5, in step S506, according to the N die test information DieInf1-DieInfN, the test control device 130 displays the die state distribution diagram corresponding to the actual physical positions of the M dies D1-DM on the display device 140. For example, in FIG. 7A, the die state distribution diagram F1 shows the actual physical positions of the dies that need repairing (damaged) on the wafer from the viewpoint of a wafer. The darker parts indicate the positions of the dies that need repairing. In this way, through the neural network operation of this disclosure, the results similar to those obtained by the system for displaying and testing each damaged bit may be obtained.

Figure 7B:
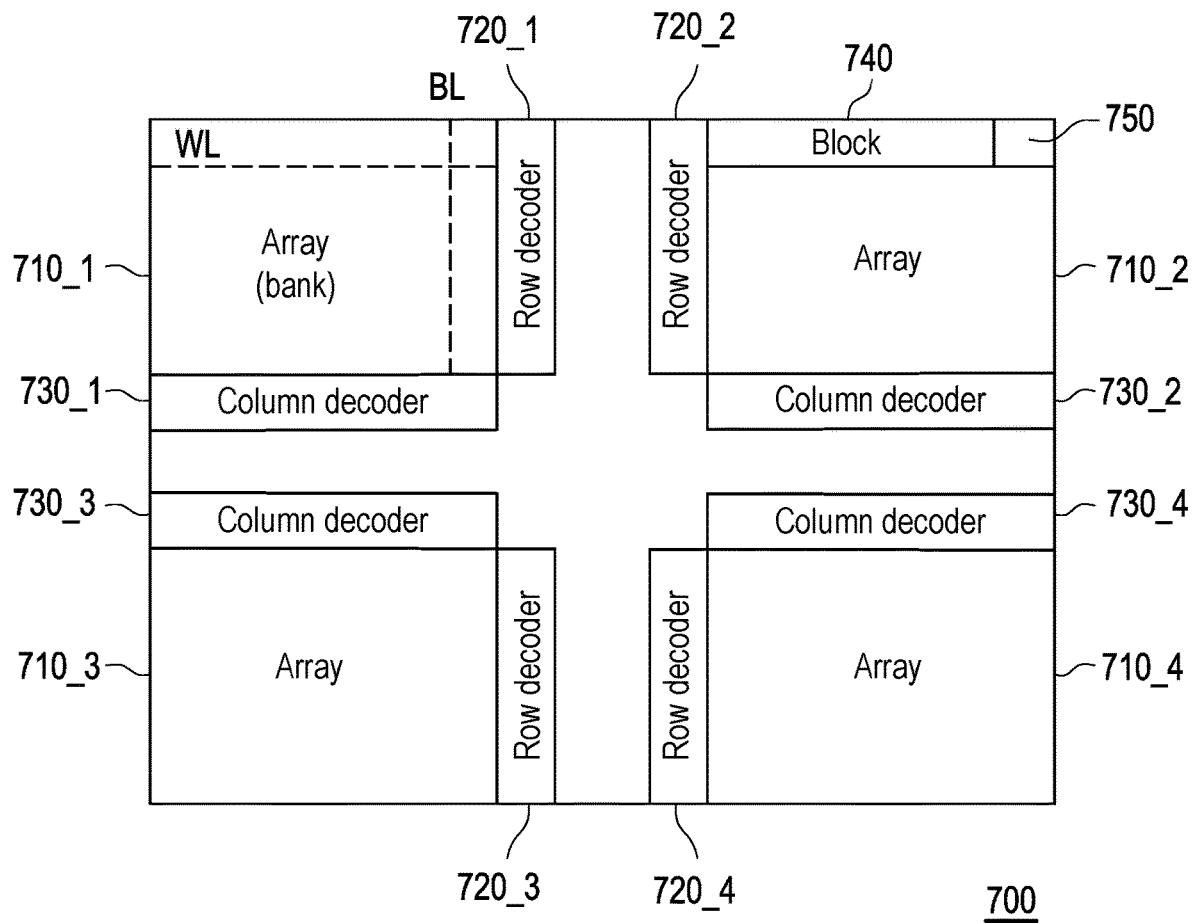
FIG. 7B is an example of an internal structure of a die according to an embodiment of the disclosure.

In an embodiment, the internal structure of the dies may also be referred to display a more detailed die state distribution diagram. For example, FIG. 7B shows an example of the internal structure of a die according to an embodiment of the disclosure. The die internal structure 700 includes four arrays (or banks) 710_1~710_4, four row decoders 720_1~720_4 and four column decoders 730_1~730_4. The word line WL and the bit line BL are illustrated by dotted lines on the array 710_1. In this embodiment, the word line WL may be regarded as a row position, and the bit line BL may be regarded as a column position. In this way, as long as the repair address is obtained according to the die test information, it may be converted into the actual physical position on the die internal structure 700.

Figure 7C:
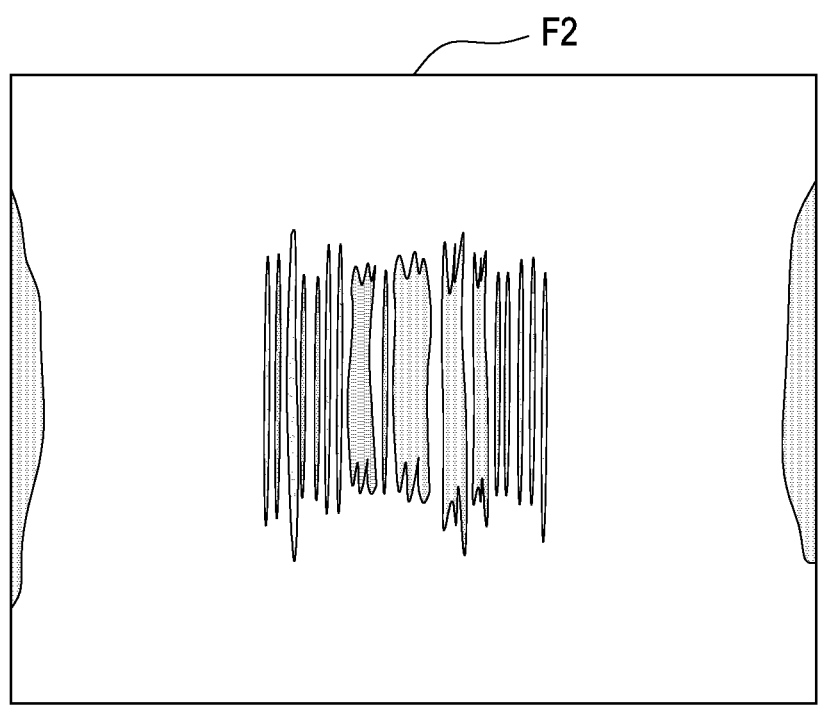

In addition, a block 740 is illustrated on the array 710_2 as an example, and a segment 750 may be further divided from the block 740. If the segment 750 is set as a selected range, as shown in FIG. 7C, in the die state distribution diagram F2, the darker gray scale part may also be used to represent the distribution of the dies to be repaired within the selected segment 750. In an embodiment, the depth of the color may also be used to indicate the repair numbers required at this position, and the darker the color is, the higher the repair numbers are.

Return to FIG. 5, in step S508, based on the test sequence, the test control device 130 calculates sequentially the staged yield of each test program TP1~TPN according to the N die test information DieInf1~DieInfN. In this embodiment, the detailed steps of calculating the staged yield of each test program TP1~TPN may refer to the steps in FIG. 8.

Figure 8:
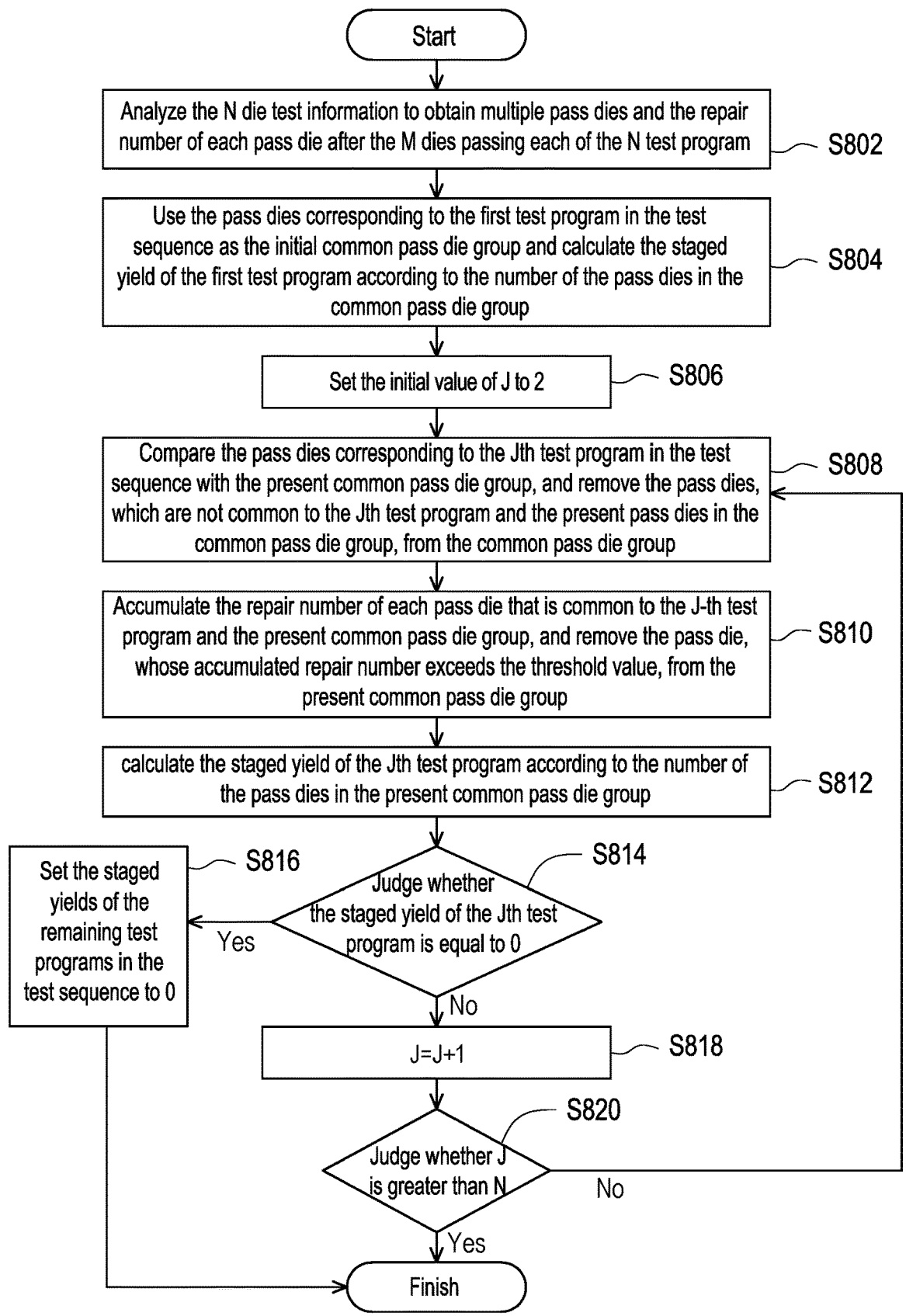

Refer to FIG. 1 and FIG. 8. First, in step S802, the test control device 130 analyzes the N die test information DieInf1~DieInfN to obtain multiple pass dies and the repair number of each pass die after the M dies pass each of the N test program. In this embodiment, the pass die refers to, for example, a die that does not need any repair, whose damaged positions may be repaired to be a pass die by virtue of repair rules, and whose sum of the number of all repair positions or regional repair positions has not exceeded the preset threshold value (for example, 4000) of this die. It should be noted that, for the position to be repaired (damaged) of each die, the memory device at the position to be repaired (damaged) may be replaced by a redundant memory device pre-set in the die to maintain the normal function of the die. The threshold value of this implementation is set according to the number and rules of the redundant memory device.

Next, in step S804, the test control device 130 uses the pass dies corresponding to the first test program in the preset test sequence as the initial common pass die group, and calculates the staged yield of the first test program according to the number of the pass dies in the common pass die group. For example, the staged yield is equal to the ratio of the number of the pass dies in the present pass die group to the number of the tested dies D1~DM. Since it is the first test program, its staged yield may only reflect the condition of the pass dies in the first test program.

Next, in step S806, the test control device 130 sets the initial value of J to 2.

Next, in step S808, the test control device 130 compares the pass dies corresponding to the J-th test program in the test sequence with the present common pass die group, and removes the pass dies, which are not common to the J-th test program and the present common pass die group, from the common pass die group. For example, when step S808 is executed for the first time, the test control device 130 compares the pass dies corresponding to the second test program in the preset test sequence with the present common pass die group (including the pass dies corresponding to the first test program), and removes the pass dies, which are not common to the second test program and the present common pass die group, from the common pass die group. Since J will be subsequently incremented, when step S808 is executed for the second time, the test control device 130 compares the pass dies corresponding to the third test program in the preset test sequence with the present common pass die group (including the common pass dies corresponding to the first and the second test program), and removes the pass dies, which are not common to the third test program and the present common pass die group, from the common pass die group, and so forth.

Next, in step S810, the test control device 130 accumulates the repair number of each pass die that is common to the J-th test program and the present common pass die group, and removes the pass dies, whose accumulated repair numbers exceeds the threshold value or the regional repair rule number, from the present common pass die group. In other words, even if it is a pass die that is common to the test programs, once the sum of the repair numbers of the pass die for several test programs exceeds the preset threshold value of this die or exceeds the regional repair rule number, it may also be regarded as a fail die and removed from the common pass die group.

Next, in step S812, the test control device 130 calculates the staged yield of the J-th test program according to the number of the pass dies in the present common pass die group. In other words, when step S812 is executed every time, only the pass dies, which are common to all the compared test programs and whose repair numbers do not exceed the threshold value and the regional repair rule number, are left in the common pass die group, and the resulting staged yield reflects the condition of the pass dies for all test programs that have been compared before.

Next, in step S814, the test control device 130 judges whether the staged yield of the J-th test program is equal to 0. If the case is 'yes', it means that the number of the pass dies in the common pass die group is 0, so in step S816, the test control device 130 sets the staged yields of the remaining test programs in the test sequence to 0.

If the case is 'not', the test control device 130 increments J (J=J+1). In step S820, the test control device 130 judges whether the incremented J is greater than N or not.

When J is not greater than N, it means that there are still remaining test programs whose staged yields have not been generated. The test control device 130 may return to step S808, and may continue to repeat steps S808, S810, S812, S814, S816 and S820 until it is determined in step S814 that the staged yield of the present test program is equal to 0 or in step S816, J is incremented until it is greater than N.

When J is greater than N, it means that the corresponding staged yields have been generated for all test programs.

Regarding how to sort the test sequence, for example, the test control device 130 may analyze the N die test information DieInf1~DieInfN to obtain multiple pass dies, the number of the pass dies, and the repair address of each pass die, after the M dies D1~DM pass each test program TP1~TPN. Moreover, the test control device 130 may sort the test sequence of the N test programs TP1~TPN according to the number of common pass dies and the common repair addresses that are common the N test programs TP1~TPN. For example, the test control device 130 may arrange the test programs with more common pass dies or fewer repair addresses forward, and may arrange the more serious test programs backward, so as to maximize the yield of each stage and to find the best sequence with the yield or the more serious test program items.

Alternatively, the input device 150 may also be configured to receive sorting operations from the user. The test control device 130 may sort the test sequence of the N test programs TP1~TPN according to the sorting operation received through the input device 150. Users may adjust the order and combination of operations arbitrarily according to their actual needs.

Figure 9:
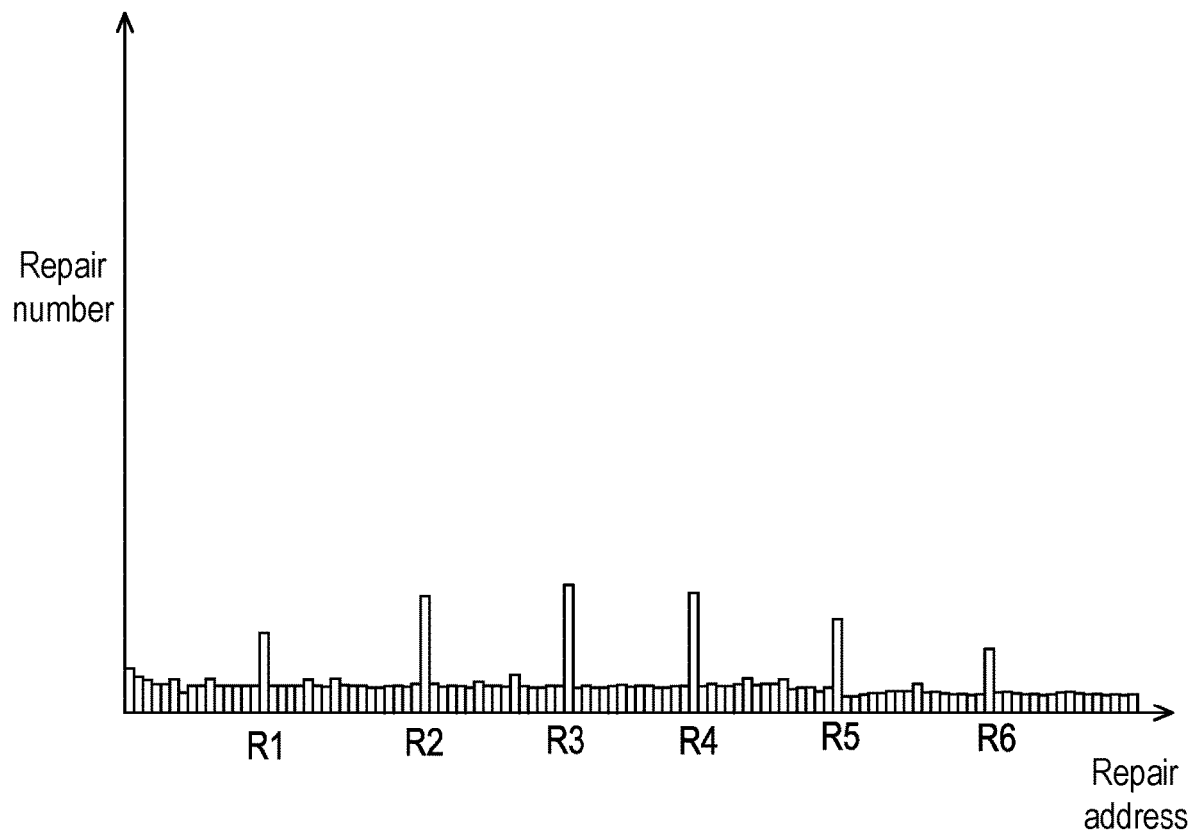
FIG. 9 is an example of a die state displaying method according to an embodiment of the disclosure.

Refer to FIG. 5, in step S510, the test control device 130 respectively accumulates the repair numbers of the same repair address that is common to the N test programs TP1~TPN according to the N die test information DieInf1~DieInfN, and displays the accumulated repair numbers on the display device 140 in a manner associated with the repair addresses. Specifically, the test control device 130 may accumulate and display the repair numbers of all the same repair addresses within the selected range. As shown in FIG. 9, in the histogram 900, the vertical axis is repair number, and the horizontal axis is repair address, thereby displaying the accumulated repair number for each repair address. It may be clearly seen that the repair numbers of the six repair addresses R1~R6 is higher, which is provided for the user to analyze the problem and to judge the reliability.

The conventional testing method may need to test each capacitance characteristic inside the die one by one, and it may take 3 to 4 hours to execute a test program. In addition, if features in a particular chip need to be observed, additional tests need to be arranged. Compared with this, this disclosure only focuses on the judgment of pass dies and their repair numbers, and may compare and process with the repair address information such as row and column. In practical applications, it only takes about 10 minutes to execute a test program. Moreover, all required test data has been independently generated at the beginning of the test procedure, even if features in a specific chip need to be observed, there is no need to arrange additional tests. In this way, the effect of greatly shortening the testing time may be achieved.

To sum up, the disclosure may obtain "independent" test data (test results) of each test program. These "independent" test data are utilized, according to the repair numbers and repair addresses, and then the neural network operation is performed to estimate the yield of the die. Moreover, users may adjust the order and combination of operations arbitrarily according to their actual needs. In this way, more effective data may be obtained and the testing time may be greatly shortened.

Although the disclosure has been disclosed above with the embodiments, it is not intended to limit the disclosure. Those skilled in the art may make some changes and modifications without departing from the spirit and scope of the disclosure. The scope of protection of the disclosure should be defined by the scope of the appended patent application.

What is claimed is:

1. A memory testing method, comprising:
   using a test program group comprising N test programs to test M dies respectively to generate independent N test data, wherein N and M are positive integers greater than 1; and
   performing a neural network operation on the N test data to estimate a yield of the M dies passing the test program group,
   wherein each of the N test data comprises M sub-test data respectively corresponding to the M dies,
   wherein performing the neural network operation on the N test data to estimate the yield of the M dies passing the test program group comprises:
   decoding the M sub-test data of each of the N test data to obtain N repair address data respectively corresponding to the N test programs;
   obtaining N die test information respectively corresponding to the N test programs according to the N repair address data; and
   calculating sequentially a staged yield of each of the N test programs according to the N die test information based on a test sequence,
   wherein based on the test sequence, calculating sequentially the staged yield of each of the N test programs according to the N die test information comprises:
   analyzing the N die test information to obtain a plurality of pass dies and repair numbers of each of the pass dies after the M dies passing each of the N test programs; and
   using the pass dies corresponding to a first test program in the test sequence as an initial common pass die group, and calculating a staged yield of the first test program according to the number of the pass dies in the common pass die group.

2. The memory testing method of claim 1, wherein using the test program group comprising the N test programs to test the M dies respectively to generate the N independent test data comprises:
   setting an initial value of K to 1;
   using a K-th test program in the test program group to test the M dies respectively to generate the test data corresponding to the K-th test program;
   storing the test data corresponding to the K-th test program; and
   incrementing K, and repeating the step of using the K-th test program in the test program group to test the M dies respectively, the step of storing the test data corresponding to the K-th test program, and the step of incrementing K until K being greater than N.

3. The memory testing method of claim 1, wherein each of the M sub-test data comprises a piece of die position information, a piece of row repair number information, a piece of column repair number information, and a piece of row and column repair position information.

4. The memory testing method of claim 1, wherein based on the test sequence, calculating sequentially the staged yield of each of the N test programs according to the N die test information further comprises:
   setting an initial value of J to 2;
   comparing the pass dies corresponding to a J-th test program in the test sequence with the present common pass die group, and removing the pass dies, which are not common to the J-th test program and the present pass die group, from the common pass die group;
   accumulating the repair number of each of the pass dies that is common to the J-th test program and the present common pass die group, and removing the pass dies, whose accumulated repair numbers exceeds a threshold value or a regional repair rule number, from the present common pass die group;

calculating a staged yield of the J-th test program according to the number of the pass dies in the present common pass die group;

judging whether the staged yield of the J-th test program is equal to 0;

if 'yes', setting the staged yields of the remaining test programs in the test sequence to 0; and if 'no', incrementing J, and repeating removing the pass dies, which are not common to the J-th test program and the present common pass die group, from the common pass die group, removing the pass dies, whose accumulated repair numbers exceed the threshold value, from the present common pass die group, calculating the staged yield of the J-th test program, judging the staged yield of the J-th test program, and incrementing J until the staged yield of the J-th test program being 0 or J being greater than N.

5. The memory testing method of claim 1, wherein performing the neural network operation on the N test data to estimate the yield of the M dies passing the test program group further comprises:

displaying a die state distribution diagram corresponding to actual physical positions of the M dies according to the N die test information.

6. The memory testing method of claim 5, wherein performing the neural network operation on the N test data to estimate the yield of the M dies passing the test program group further comprises:

accumulating respectively repair numbers of the same repair address that is common to the N test programs according to the N die test information, and displaying the accumulated repair number in a manner associated with the repair address.

7. The memory testing method of claim 1, wherein performing the neural network operation on the N test data to estimate the yield of the M dies passing the test program group further comprises:

analyzing the N die test information to obtain a plurality of pass dies, the number of the pass dies, and repair positions of each of the pass dies after the M dies passing each of the N test programs; and sorting the test sequence of the N test programs according to the number of the common pass dies and common repair addresses that are common to the N test programs.

8. The memory testing method of claim 1, wherein performing the neural network operation on the N test data to estimate the yield of the M dies passing the test program group further comprises:

receiving a sorting operation to sort the test sequence of the N test programs.

9. A memory testing apparatus, comprising:
a clamp configured to clamp M dies to be tested;
a storage device configured to store a test program group; and
a test control device, coupled to the clamp and the storage device, configured to:
use the test program group comprising N test programs to test the M dies respectively to generate independent N test data, wherein N and M are positive integers greater than 1; and
perform a neural network operation on the N test data to estimate a yield of the M dies passing the test program group, wherein each of the N test data comprises M sub-test data respectively corresponding to the M dies, wherein the test control device decodes the M sub-test data of each of the N test data to obtain N repair address data respectively for the N test programs, and obtains N die test information respectively corresponding to the N test programs according to the N repair address data, and based on a test sequence, sequentially calculates a staged yield of each of the N test programs according to the N die test information, wherein the test control device analyzes the N die test information to obtain a plurality of pass dies and repair number of each of the pass dies after the M dies pass each of the N test programs, and uses the pass dies corresponding to a first test program in the test sequence as an initial common pass die group, and calculates a staged yield of the first test program according to the number of the pass dies in the common pass die group.

10. The memory testing apparatus of claim 9, wherein the test control device sets an initial value of K to 1, uses a K-th test program in the test program group to test the M dies respectively, so as to generate the test data corresponding to the K-th test program, and stores the test data corresponding to the K-th test program in the storage device, the test control device increments K, and repeats using a K-th test program in the test program group to test the M dies respectively, storing the test data corresponding to the K-th test program, and incrementing K until K is greater than N.

11. The memory testing apparatus of claim 9, wherein each of the M sub-test data comprises a piece of die position information, a piece of row repair number information, a piece of column repair number information, and a piece of row and column repair position information.

12. The memory testing apparatus of claim 9, wherein
the test control device sets an initial value of J to 2, compares the pass dies corresponding to the J-th test program in the test sequence with the present common pass die group, removes the pass dies, which are not common to the J-th test program and the present common pass die group, from the common pass die group, and accumulates the repair number of each of the pass dies that is common to the J-th test program and the present common pass die group, removes the pass dies, whose accumulated repair numbers exceeds a threshold value or a regional repair rule number, from the present common pass die group, and calculates a staged yield of the J-th test program according to the number of the pass dies in the present common pass die group;

the test control device judges whether the staged yield of the J-th test program is equal to 0, if 'yes', the test control device sets the staged yields of the remaining test programs in the test sequence to 0, if 'no', the test control device increments J, and repeats removing the pass dies, which are not common to the J-th test program and the present common pass die group, from the common pass die group, removing the pass dies, whose accumulated repair numbers exceed the threshold value or a regional repair rule number, from the present common pass die group, calculating the staged yield of the J-th test program, judging the staged yield of the J-th test program, and incrementing J until the staged yield of the J-th test program is 0 or J is greater than N.

13. The memory testing apparatus of claim 9, wherein the memory testing apparatus further comprises a display device coupled to the test control device,
    wherein the test control device displays a die state distribution diagram corresponding to actual physical positions of the M dies on the display device according to the N die test information.

14. The memory testing apparatus of claim 13, wherein according to the N die test information, the test control device respectively accumulates a repair number of the same repair address that is common to the N test programs, and displays the accumulated repair numbers in a manner associated with the repair addresses on the display device.

15. The memory testing apparatus of claim 9, wherein the test control device analyzes the N die test information to obtain a plurality of pass dies, the number of the pass dies, and repair addresses of each of the pass dies after the M dies pass each of the N test programs, and sorts the test order of the N test programs according to the number of the common pass dies and the common repair addresses that are common to the N test programs.

16. The memory testing apparatus of claim 9, wherein the memory testing apparatus further comprises:
    an input device, coupled to the test control device, configured to receive a sorting operation, so that the test control device sorts the test order of the N test programs.

\* \* \* \* \*